(12) United States Patent
Han

(10) Patent No.: US 12,052,895 B2
(45) Date of Patent: Jul. 30, 2024

(54) DISPLAY PANEL, DISPLAY MOTHERBOARD, AND DISPLAY DEVICE

(71) Applicant: Shenzhen China Star Optoelectronics Semiconductor Display Technology Co., Ltd., Shenzhen (CN)

(72) Inventor: Zhibin Han, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/417,403

(22) PCT Filed: May 28, 2021

(86) PCT No.: PCT/CN2021/096613
§ 371 (c)(1),
(2) Date: Jun. 23, 2021

(87) PCT Pub. No.: WO2022/142110
PCT Pub. Date: Jul. 7, 2022

(65) Prior Publication Data
US 2023/0337471 A1    Oct. 19, 2023

(30) Foreign Application Priority Data
Dec. 30, 2020   (CN) .......................... 202011603328.4

(51) Int. Cl.
*H10K 59/122*   (2023.01)
*H10K 59/35*   (2023.01)
*H10K 59/38*   (2023.01)

(52) U.S. Cl.
CPC ......... *H10K 59/122* (2023.02); *H10K 59/353* (2023.02); *H10K 59/38* (2023.02)

(58) Field of Classification Search
None
See application file for complete search history.

(56) References Cited

U.S. PATENT DOCUMENTS

| | | | |
|---|---|---|---|
| 2014/0197385 A1* | 7/2014 | Madigan | H10K 59/122 438/34 |
| 2016/0013251 A1* | 1/2016 | Yoshida | H10K 59/122 257/40 |
| 2017/0194414 A1 | 7/2017 | Lee | |

(Continued)

FOREIGN PATENT DOCUMENTS

| | | |
|---|---|---|
| CN | 1734746 A | 2/2006 |
| CN | 104885251 A | 9/2015 |
| CN | 105552099 A | 5/2016 |

(Continued)

*Primary Examiner* — Cory W Eskridge
(74) *Attorney, Agent, or Firm* — Nathan & Associates; Menachem Nathan

(57) ABSTRACT

The application provides a display panel, a display motherboard, and a display device. Each pixel repeating unit in the display panel includes a first pixel. The first pixel has: a first sub-pixel with a long side extending in a first direction; and a second sub-pixel and a third sub-pixel arranged in the first direction. The first sub-pixel, the second sub-pixel, and the third sub-pixel are respectively located on both sides of a corresponding first bank, so as to reduce number of the first bank. Therefore, a pixel area ratio is improved, which is beneficial to mass production.

20 Claims, 8 Drawing Sheets

(56) References Cited

U.S. PATENT DOCUMENTS

2021/0399062 A1* 12/2021 Han .................... H10K 59/122

FOREIGN PATENT DOCUMENTS

| CN | 108231827 A | 6/2018 |
| CN | 108281462 A | 7/2018 |
| CN | 111200004 A | 5/2020 |
| CN | 111524937 A | 8/2020 |
| CN | 112018150 A | 12/2020 |
| CN | 112599585 A | 4/2021 |

* cited by examiner

DISPLAY PANEL, DISPLAY MOTHERBOARD, AND DISPLAY DEVICE

FIELD OF DISCLOSURE

The present disclosure relates to displays, and more particularly to a display panel, a display motherboard, and a display device.

BACKGROUND OF DISCLOSURE

In order to make a blue sub-pixel have a higher aperture ratio, a size of red and green sub-pixels will be compressed, which will seriously make the size of the red and green sub-pixels unable to meet process requirements of a Line-Bank printing method (Linear bank printing method: print a whole strip of sub-pixels of a same color in a same bank area).

SUMMARY OF DISCLOSURE

Embodiments of the present application provide a display panel board, a display motherboard, and a display device, which can take into account both a pixel aperture ratio requirement and a printing process requirement.

An embodiment of the present application provides a display panel, including: a plurality of first banks arranged at intervals, wherein each of the first banks extends in a first direction, and the plurality of first banks are arranged in a second direction; and a plurality of pixel repeating units, wherein each of the pixel repeating units includes a first pixel, wherein the first pixel includes: a first sub-pixel, wherein a long side of the first sub-pixel extends along the first direction; and a second sub-pixel and a third sub-pixel arranged in the first direction in the first direction, wherein the first sub-pixel of the first pixel together with the second sub-pixel and the third sub-pixel of the first pixel are respectively located on both sides of a corresponding first bank.

The present application further provides a display motherboard. The display motherboard includes: a plurality of first banks arranged at intervals, wherein each of the first partitions extends in a first direction, and the plurality of first banks are arranged along a second direction; a plurality of display panels including first display panels and second display panels with different sizes, wherein a long side of the first display panels is parallel to the first banks, and a short side of the second display panels is parallel to the first banks. Each of the first display panels includes a plurality of pixel repeating units, and each of the pixel repeating units includes a plurality of pixels, wherein each of the pixels includes: a first sub-pixel; and a second sub-pixel and a third sub-pixel arranged along the first direction. A long axis of the first sub-pixel is parallel to the first banks, and the first sub-pixel together with the second sub-pixel and the third sub-pixel arranged along the first direction are respectively located on both sides of the first bank.

The present application also provides a display device including any of the above-mentioned display panels.

Compared with conventional technologies, embodiments of the present application provide a display panel board, a display motherboard, and a display device. The display panel includes: a plurality of first banks arranged at intervals, wherein each of the first banks extends in a first direction, and the plurality of first banks are arranged in a second direction; and a plurality of pixel repeating units, wherein each of the pixel repeating units includes a first pixel, wherein the first pixel includes: a first sub-pixel, wherein a long side of the first sub-pixel extends along the first direction; and a second sub-pixel and a third sub-pixel arranged in the first direction in the first direction, wherein the first sub-pixel of the first pixel together with the second sub-pixel and the third sub-pixel of the first pixel are respectively located on both sides of a corresponding first bank. In conventional technologies, when the first sub-pixel, the second sub-pixel, and the third sub-pixel are arranged along the second direction, three first banks are required. In the embodiment of the present application, the second sub-pixel and the third sub-pixel are arranged along a first direction, and the second sub-pixel and the third sub-pixel together with the first sub-pixel are located on both sides of the first bank, respectively. Number of the first banks can be reduced, thereby improving the pixel area ratio. Therefore, the display panel takes into account both the aperture ratio requirement and the printing process requirement, which is beneficial to mass production.

DETAILED DESCRIPTION OF PREFERRED EMBODIMENTS

In order to make the purpose, technical solutions, and effects of this application clear and distinct, the following further describes this application in detail with reference to the accompanying drawings and examples. It should be understood that the specific embodiments described here are only used to explain the present application, and are not used to limit the present application.

Figure 1A:
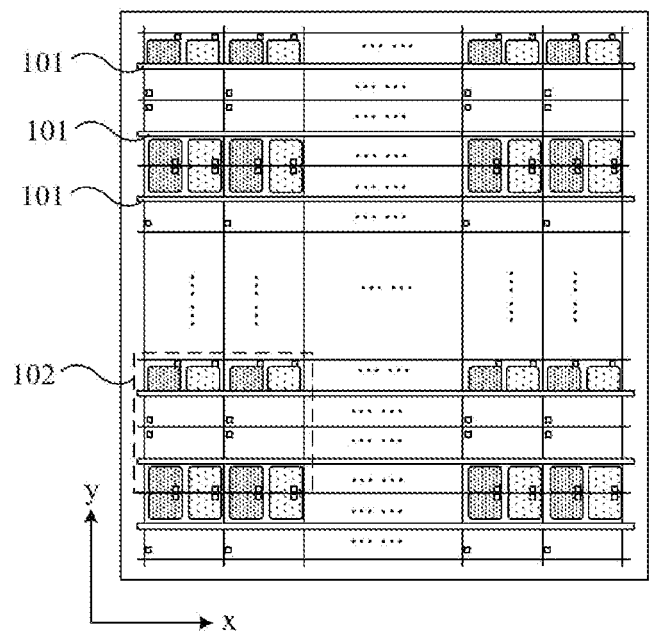
FIG. 1A to FIG. 1B are schematic structural diagrams of a display panel provided by embodiments of the application.
Figure 1B:
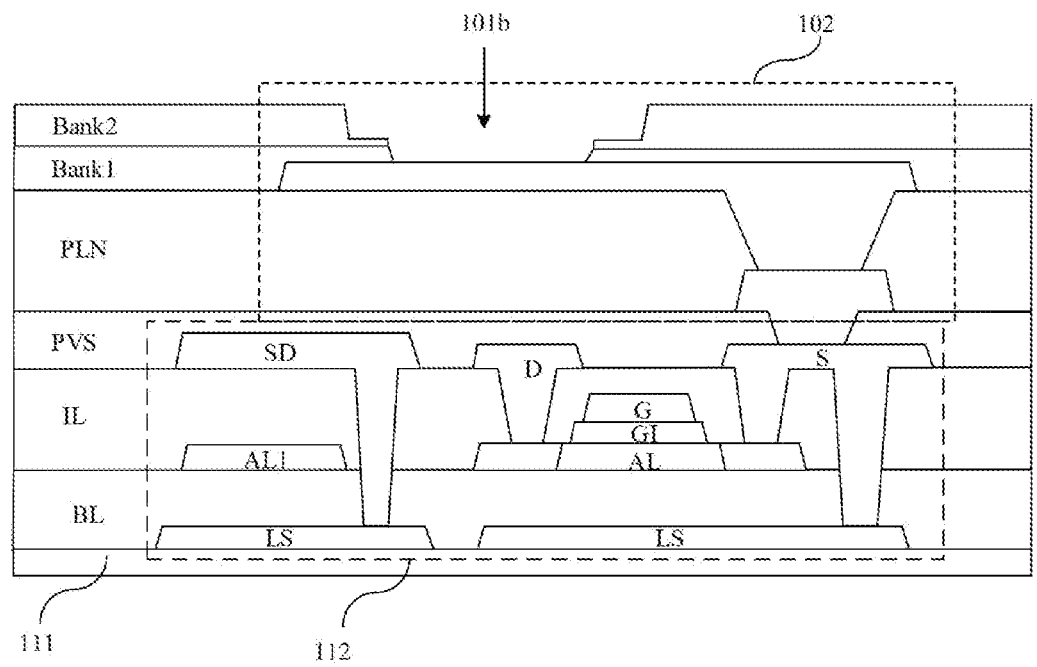

FIG. 1A to FIG. 1B are schematic structural diagrams of a display panel provided by embodiments of the application. FIG. 2A to FIG. 2G are schematic structural diagrams of pixel repeating units provided by embodiments of the application.

An embodiment of the present application provides a display panel. Optionally, the display panel is an organic light-emitting diode (OLED) display panel.

The display panel includes: a plurality of first banks 101 arranged at intervals, wherein each of the first banks 101 extends along the first direction x, and the plurality of first banks 101 is arranged along the second direction y; and a plurality of pixel repeating units 102, wherein each of the pixel repeating units 102 includes a plurality of pixels, and each of the pixels includes a plurality of sub-pixels.

The plurality of pixels includes a first pixel 103, and the first pixel 103 includes a first sub-pixel 1031, a second sub-pixel 1032, and a third sub-pixel 1033. A long side of the first sub-pixel 1031 of the first pixel 103 extends along the first direction x, i.e., a long axis of the first sub-pixel 1031 of the first pixel 103 is parallel to the first bank 101. The second sub-pixel 1032 and the third sub-pixel 1033 of the first pixel 103 are arranged along the first direction x. The first sub-pixel 1031 of the first pixel 103 together with the second sub-pixel 1032 and the third sub-pixel 1033 of the first pixel 103 are respectively located on both sides of a corresponding first bank 101.

In conventional technologies, when the first sub-pixel 1031, the second sub-pixel 1032, and the third sub-pixel 1033 are arranged along the second direction y, three first banks are required. In the embodiment of the present application, the second sub-pixel 1032 and the third sub-pixel 1033 are arranged along a first direction x, and the second sub-pixel 1032 and the third sub-pixel 1033 together with the first sub-pixel 1031 are located on both sides of the first bank 101, respectively. Number of the first banks 101 can be reduced, thereby improving the pixel area ratio. Therefore, the display panel takes into account both the aperture ratio and the printing process requirement, reduces the difficulty of the manufacturing process of the display panel, facilitates mass production, and realizes a high-resolution design of the display panel.

Optionally, colors of lights emitted by the first sub-pixel 1031, the second sub-pixel 1032, and the third sub-pixel 1033 are different. Further, the colors of the lights emitted by the first sub-pixel 1031, the second sub-pixel 1032, and the third sub-pixel 1033 include blue, red, green, and white. Furthermore, the colors of the lights emitted by the first sub-pixel 1031, the second sub-pixel 1032, and the third sub-pixel 1033 are blue, red, and green in order, so as to make the first sub-pixel 1031 emitting blue light have a larger aperture ratio, the problem of poor light-emitting efficiency of the first sub-pixel 1031 emitting blue light is improved.

Further, the pixels of each of the pixel repeating units 102 further include second pixels 104. The second pixels 104 are arranged on a side of the first pixels 103 along the second direction y. The second pixel 104 and the first pixel 103 are symmetrically arranged along an adjacent edge of the second pixel 104 and the first pixel 103. The second pixel 104 includes a first sub-pixel 1041, and a second sub-pixel 1042, and a third sub-pixel 1043 arranged along the first direction x. The first sub-pixel 1041 of the second pixel 104 extends along the first direction x, i.e., a long axis of the first sub-pixel 1041 of the second pixel 104 is parallel to the first bank 101. The first sub-pixel 1041 of the second pixel 104 together with the second sub-pixel 1042 and the third sub-pixel 1043 of the second pixel 104 are respectively located on both sides of another corresponding first bank 101.

Specifically, the first bank 101 includes a first sub-bank 1011 and a second sub-bank 1012. Please refer to FIGS. 2A~2B and FIG. 2D. The first sub-pixel 1031 of the first pixel 103 is located on a first side 1011*a* of the first sub-bank 1011. The second sub-pixel 1032 of the first pixel 103 and the third sub-pixel 1033 of the first pixel 103 are adjacently arranged in the first direction x. The second sub-pixel 1032 of the first pixel 103 and the third sub-pixel 1033 of the first pixel 103 are located on a second side 1011 b of the first sub-bank 1011.

The first sub-pixel 1041 of the second pixel 104 is located on the second side 1012*b* of the second sub-bank 1012. The second sub-pixel 1042 of the second pixel 104 and the third sub-pixel 1043 of the second pixel 104 are adjacently arranged in the first direction x. The second sub-pixel 1042 of the second pixel 104 and the third sub-pixel 1043 of the second pixel 104 are located on the first side 1012*a* of the second sub-bank 1021.

The first side 1011*a* of the first sub-bank 1011 and the second side 1012*b* of the second sub-bank 1012 are adjacent to each other, such that the first pixel 103 and the second pixel 104 each include one first bank 101, and the number of the first bank 101 is reduced, which is beneficial to improve the aperture ratio of the first pixel 103 and the second pixel 104.

In addition, the first bank 101 may further include a third sub-bank 1013. Specifically, please continue to refer to FIG. 2C. The first sub-pixel 1031 of the first pixel 103 is located on the first side 1011*a* of the first sub-bank 1011. The second sub-pixel 1032 of the first pixel 103 and the third sub-pixel 1033 of the first pixel 103 are located on the second side 1011 b of the first sub-bank 1011. The first sub-pixel 1041 of the second pixel 104 is located on the first side 1012*a* of the second sub-bank 1012. The second sub-pixel 1042 of the second pixel 104 and the third sub-pixel 1043 of the second pixel 104 are located on the second side 1012*b* of the second sub-bank 1021.

The first pixel 103 and the second pixel 104 are respectively located on both sides of the third sub-bank 1013, such that the first pixel 103 and the second pixel 104 include three first pixels. The bank 101, that is, on average, the first pixel 103 and the second pixel 104 each include only 1.5 of the first bank 101. Compared with the prior art design in which each pixel includes three first banks, the number of the first bank 101 of the present application is reduced, which is beneficial to improve the aperture ratio of the first pixel 103 and the second pixel 104.

Further, please continue to refer to FIG. 2A-FIG. 2D. The plurality of pixels of each pixel repeating unit 102 further includes a third pixel 105 and the fourth pixel 106 arranged along the second direction y. The third pixels 105 are arranged on a side of the first pixels 103 along the first direction x. The third pixel 105 and the first pixel 103 are symmetrically arranged along the adjacent edges of the first pixel 103 and the third pixel 105. The fourth pixels 106 are arranged on a side of the second pixels 104 along the first direction x. The fourth pixel 106 and the second pixel 104 are symmetrically arranged along an adjacent edge of the second pixel 104 and the fourth pixel 106.

The third pixel 105 and the fourth pixel 106 each include: a first sub-pixel with a long side extending along the first direction x; and a second sub-pixel and a third sub-pixel arranged along the first direction x. The first sub-pixel 1051 of the third pixel 105 together with the second sub-pixel 1052 and the third sub-pixel 1053 of the third pixel 105 are respectively located on both sides of the corresponding first bank 101. The first sub-pixel 1061 of the fourth pixel 106 together with the second sub-pixel 1062 and the third sub-pixel 1063 of the fourth pixel 106 are respectively located on both sides of another corresponding first bank 101.

Specifically, please refer to FIG. 2A-FIG. 2D. The third pixel 105 includes: a first sub-pixel 1051 with a long axis parallel to the first bank 101; and a second sub-pixel 1052 and a third sub-pixel 1053 arranged along the first direction x. The first sub-pixel 1051 of the third pixel 105 is located on the first side 1011*a* of the first sub-bank 1011. The second sub-pixel 1052 of the third pixel 105 and the third sub-pixel 1053 of the third pixel 105 are located on the second side 1011*b* of the first sub-bank 1011.

Figure 2A:
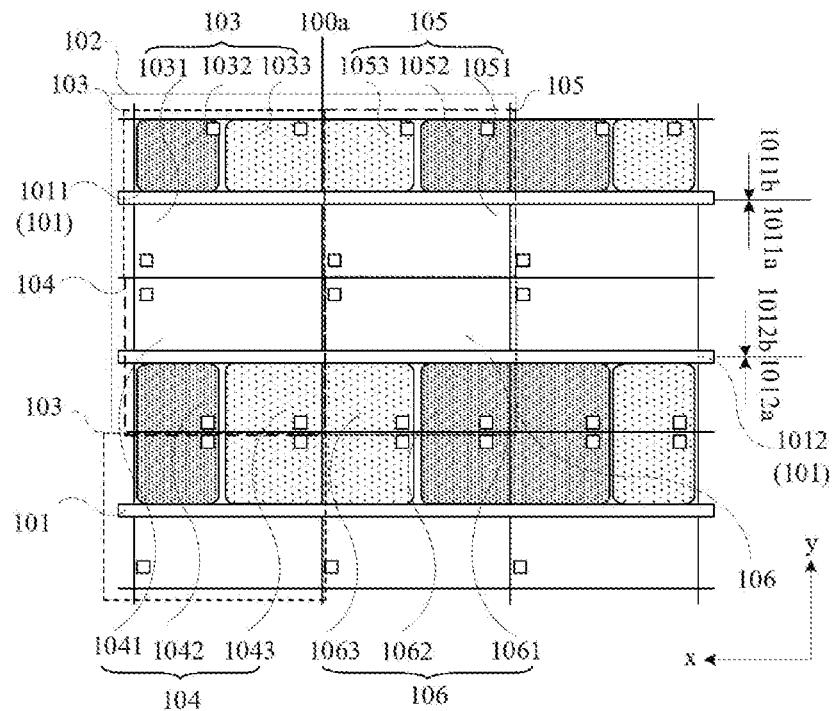
FIG. 2A to FIG. 2G are schematic structural diagrams of pixel repeating units provided by embodiments of the application.
Figure 2B:
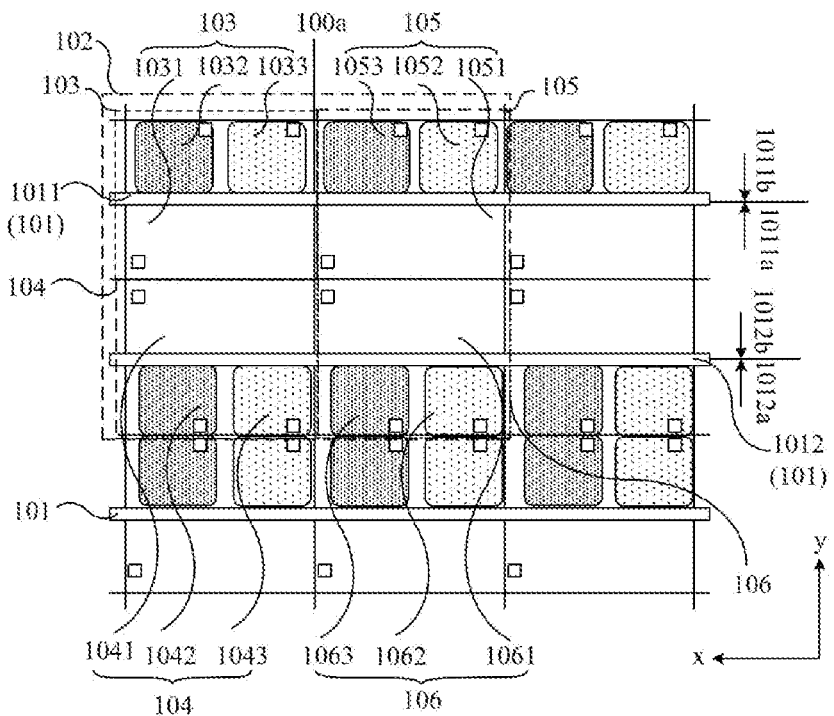
Figure 2C:
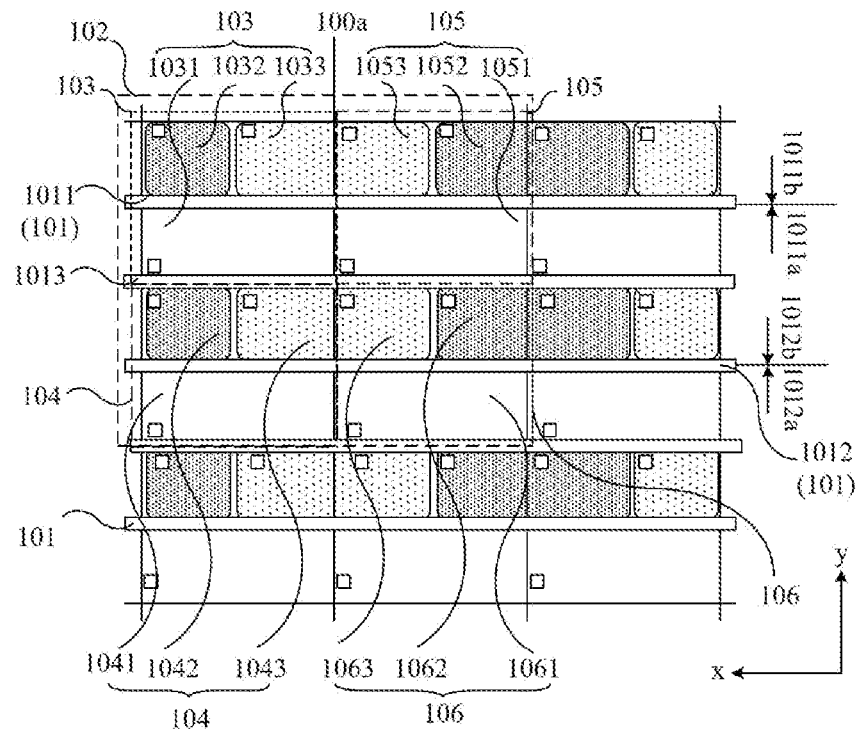
Figure 2D:
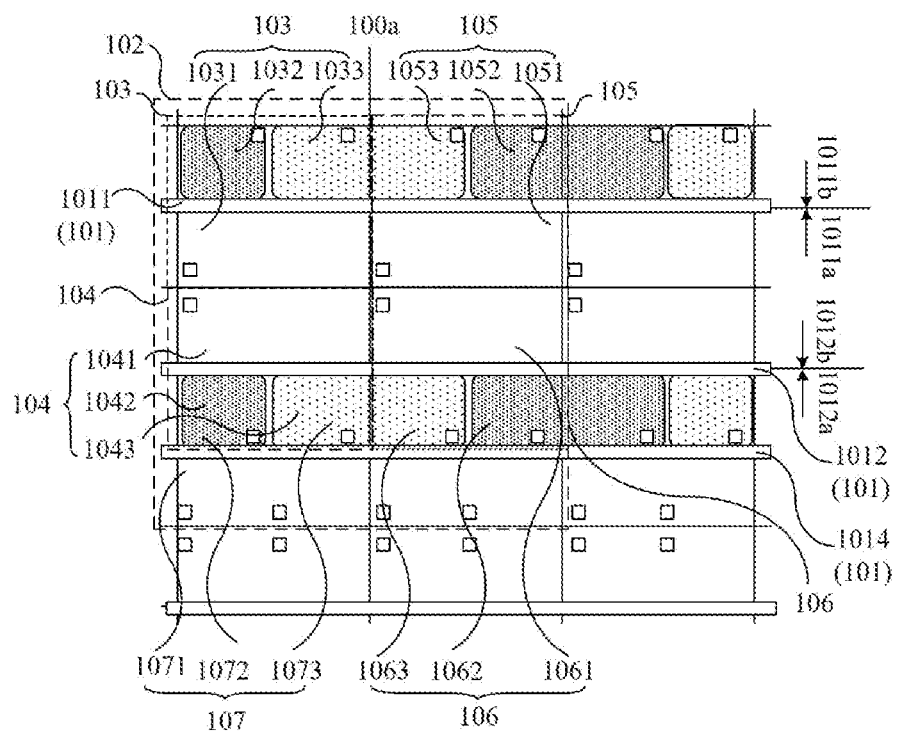

The first sub-pixel 1031 of the first pixel 103 is adjacent to the first sub-pixel 1051 of the third pixel 105. The second sub-pixel 1052 and the third sub-pixel 1053 of the third pixel 105 are arranged on one side of the third sub-pixel 1033 of the first pixel 103 along the first direction x. That is, the second sub-pixel 1052 and the third sub-pixel 1053 of the third pixel 105 may be symmetrically arranged with the second pixel 1032 and the third sub-pixel 1033 of the first pixel 103 along the first edge 100a, as shown in FIG. 2A and FIG. 2C-FIG. 2D. The second sub-pixel 1052 and the third sub-pixel 1053 of the third pixel 105 may also be arranged the same as the second pixel 1032 and the third sub-pixel 1033 of the first pixel 103, as shown in FIG. 2B. Therefore, the first pixel 103 and the third pixel 105 share the first sub-bank 1011, which reduces number of the first bank 101 required in the display panel.

Please continue to refer to FIG. 2A-FIG. 2B and FIG. 2D. The fourth pixel 106 includes: a first sub-pixel 1061 with a long axis parallel to the first bank 101; and a second sub-pixel 1062 and a third sub-pixel 1063 arranged along the first direction x. The first sub-pixel 1061 of the fourth pixel 106 is located on the second side 1012b of the second sub-bank 1012. The second sub-pixel 1062 of the fourth pixel 106 and the third sub-pixel 1063 of the fourth pixel 106 are located on the first side 1012a of the second sub-bank 1012. The first sub-pixel 1041 of the second pixel 104 is adjacent to the first sub-pixel 1061 of the fourth pixel 106. The second sub-pixel 1062 and the third sub-pixel 1063 of the fourth pixel 106 are arranged on a side of the third sub-pixel 1043 of the second pixel 104 along the first direction x. That is, the second sub-pixel 1062 and the third sub-pixel 1063 of the fourth pixel 106 may be arranged symmetrically with the second pixel 1042 and the third sub-pixel 1043 of the second pixel 104 along the first edge 100a, as shown in FIG. 2A and FIG. 2D. The second sub-pixel 1062 and the third sub-pixel 1063 of the fourth pixel 106 may also be arranged the same as the second sub-pixel 1042 and the third sub-pixel 1043 of the second pixel 104, As shown in FIG. 2B. Therefore, the second pixel 104 and the fourth pixel 106 share the second sub-bank 1012, and the number of the first bank 101 required in the display panel is reduced.

Please continue to refer to FIG. 2C. The first sub-pixel 1061 of the fourth pixel 106 is located on the first side 1012a of the second sub-bank 1012. The second sub-pixel 1062 of the fourth pixel 106 and the third sub-pixel 1063 of the fourth pixel 106 are located on the second side 1012b of the second sub-bank 1021. The third pixel 105 and the fourth pixel 106 are respectively located on both sides of the third sub-bank 1013, such that only three of the first banks 101 are included between the third pixel 105 and the fourth pixel 106. That is, on average, the third pixel 105 and the fourth pixel 106 each include only 1.5 first banks 101. The number of the first bank 101 is reduced, which is beneficial to improve the aperture ratio of the third pixel 105 and the fourth pixel 106.

It can be understood that adjacent pixels in each pixel repeating unit 102 may share a part of sub-pixels. Specifically, referring to FIG. 2D, the plurality of pixels of each pixel repeating unit 102 further includes a fifth pixel 107. The fifth pixel 107 is arranged on the side of the second pixel 104 away from the first pixel 103 along the second direction. The first bank 101 further includes a fourth sub-bank 1014. The second sub-pixel 1052 and the third sub-pixel 1053 of the third pixel 105 are located between the second sub-bank 1012 and the fourth sub-bank 1014. The first sub-pixel 1021 of the second pixel 104 is located on a side of the second sub-bank 1012 away from the fourth sub-bank 1014. The first sub-pixel 1071 of the fifth pixel 107 is located on a side of the fourth sub-bank 1014 away from the second sub-bank 1012, such that the fifth sub-pixel 1071 and the third pixel 105 share the second sub-pixel 1052 and the third sub-pixel 1053 of the third pixel 105, so as to improve the number of pixels provided on the display panel in the inherent layout space, which is beneficial to realize the high-resolution design of the display panel. In addition, the plurality of pixels of each pixel repeating unit 102 may also include a sixth pixel, a seventh pixel, etc., which will not be repeated here.

Further, in order to avoid color mixing between two adjacent sub-pixels or between two adjacent pixels along the first direction x, the display panel further includes: the second bank 110 extending along the second direction y, wherein two ends of the second bank 110 are respectively connected to the two first bank 101. The second bank 110 is located between the second sub-pixel and the third sub-pixel, or located on both sides of the first sub-pixel.

Figure 2E:
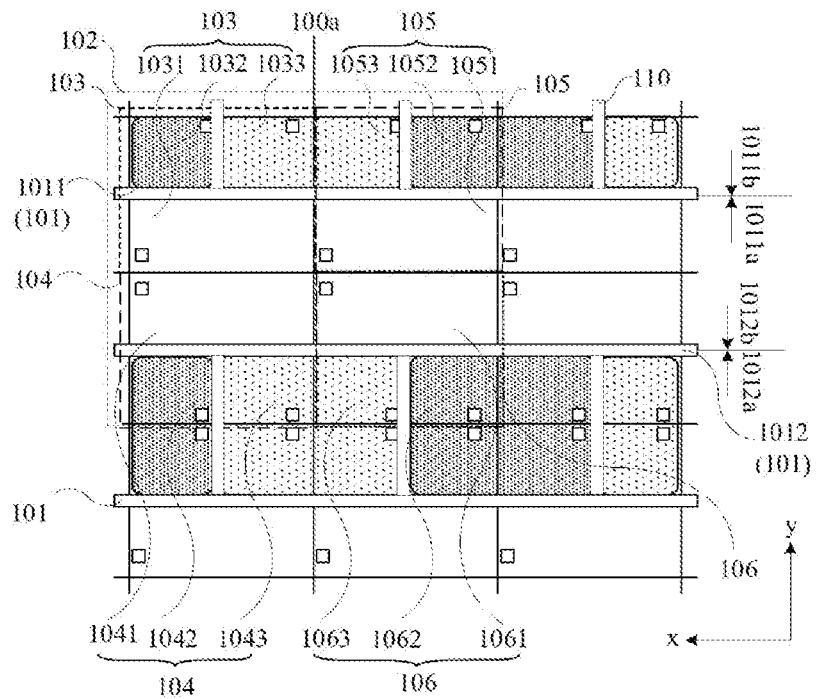
Figure 2F:
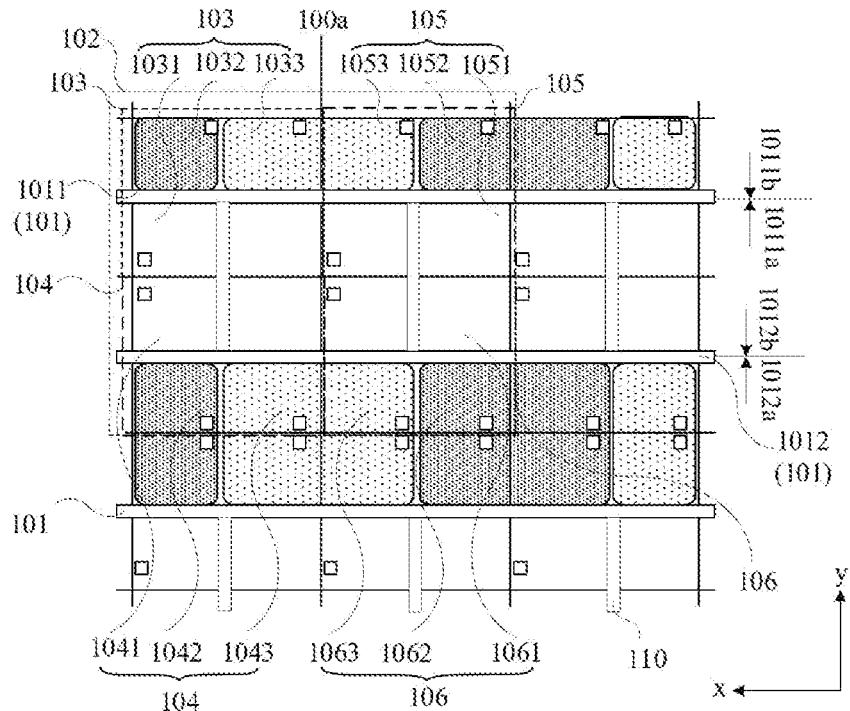
Figure 2G:
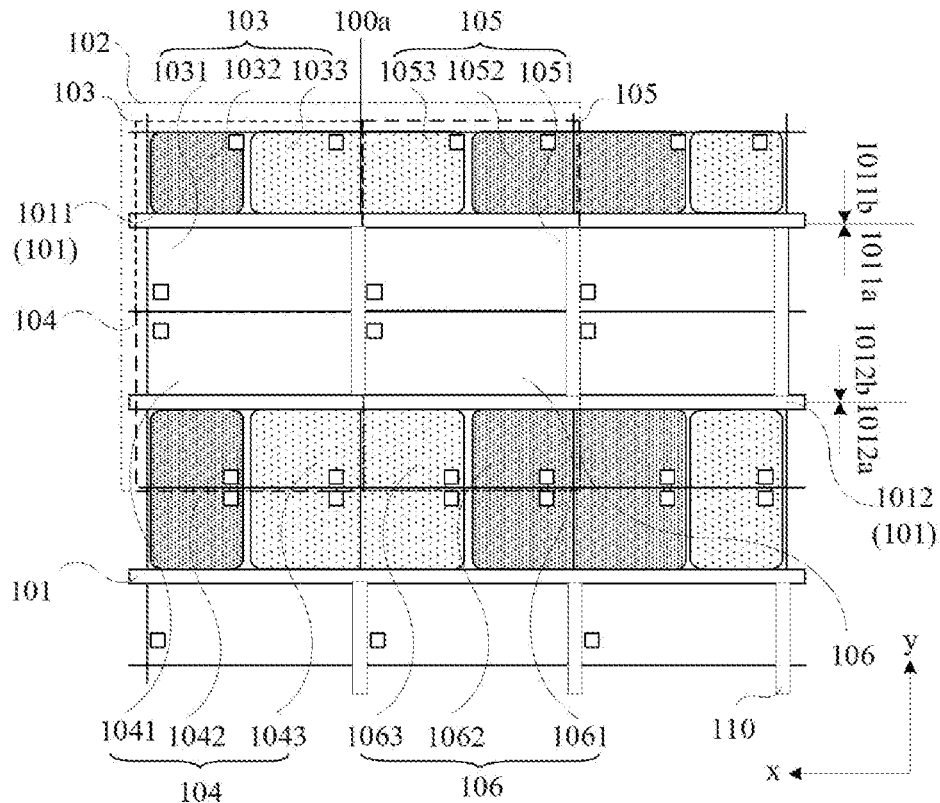

Specifically, please refer to FIG. 2E-FIG. 2G. The second bank 110 is located between the second sub-pixel 1032 and the third sub-pixel 1033 of the first pixel 103; and/or, the second bank 110 is located between the second sub-pixel 1042 and the third sub-pixel 1043 of the second pixel 104; and/or, the second bank 110 is located between the second sub-pixel 1052 and the third sub-pixel 1053 of the third pixel 105; and/or, the second bank 110 is located between the second sub-pixel 1052 and the third sub-pixel 1053 of the fourth pixel 105, as shown in FIG. 2E; and/or, the second bank 110 is located at the center of the first sub-pixel 1031 of the first pixel 103; and/or, the second bank 110 is located at the center of the first sub-pixel 1041 of the second pixel 104; and/or, the second bank 110 is located at the center of the first sub-pixel 1051 of the third pixel 105; and/or, the second bank 110 is located at the center of the first sub-pixel 1061 of the fourth pixel 106, as shown in FIG. 2F; and/or, the second bank 110 is located between the first sub-pixel 1031 of the first pixel 103 and the first sub-pixel 1051 of the third pixel 105; and/or, the second bank 110 is located between the first sub-pixel 1041 of the second pixel 104 and the first sub-pixel 1061 of the fourth pixel 106, as shown in FIG. 2G. Further, the second bank 110 is perpendicular to the first bank 101.

Figure 3A:
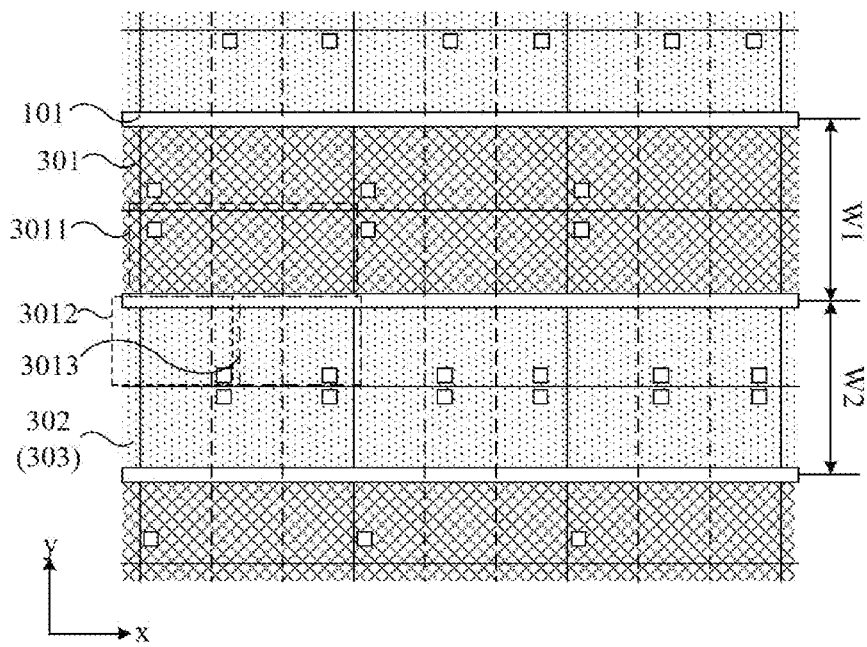
FIG. 3A to FIG. 3C are schematic structural diagrams of a first light-emitting material, a second light-emitting material, and a third light-emitting material and a first bank provided by embodiments of the application.
Figure 3B:
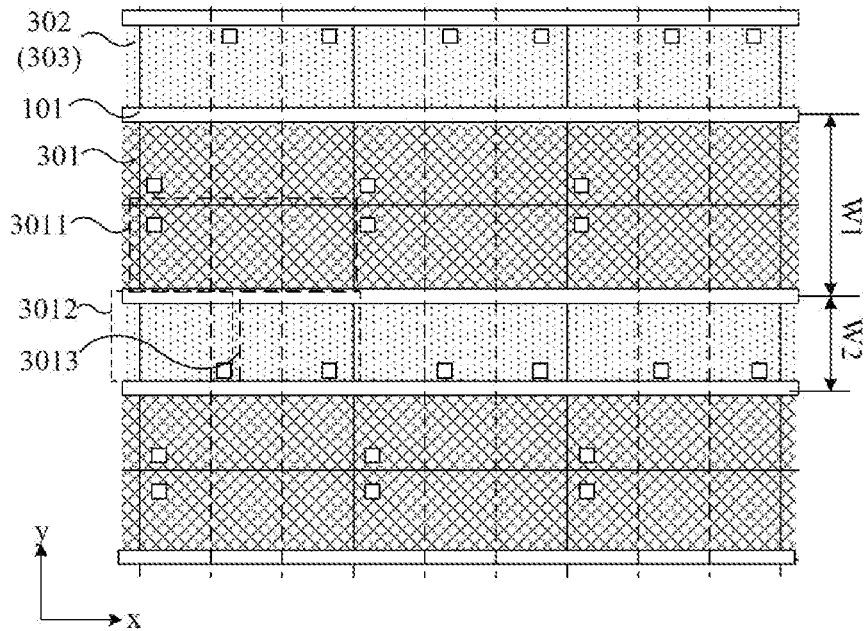
Figure 3C:
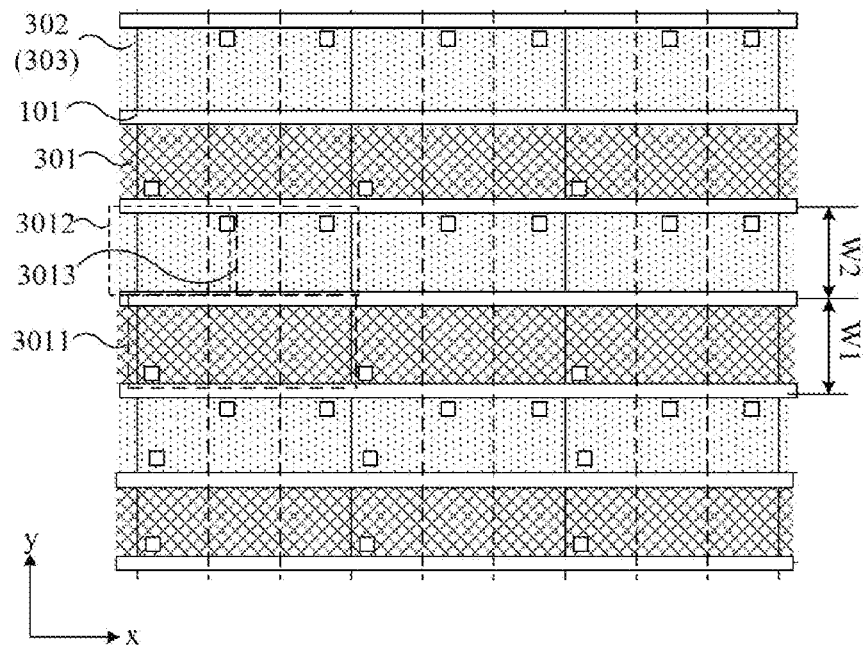

Please refer to FIGS. 3A to 3C for structural diagrams of the first light-emitting material, the second light-emitting material, and the third light-emitting material and the first bank provided by the embodiments of the application. Each of the first sub-pixels 3011 includes a first light-emitting material 301. Each of the second sub-pixels 3012 includes a second light-emitting material 302. Each of the third sub-pixels 3013 includes a third light-emitting material 303. The first light-emitting material 3011 of the first sub-pixel 301 between two adjacent first banks 101 is integrally formed. The second light-emitting material 302 of the second sub-pixel 3012 and the third light-emitting material 303 of the third sub-pixel 3013 between two adjacent first banks 101 are the same and are integrally formed.

Specifically, please continue to refer to FIG. 2A-FIG. 2D and FIG. 3A-FIG. 3C. The first sub-pixel 3011 between two adjacent first banks 101 includes: the first sub-pixel 1031 of the first pixel 103, the first sub-pixel 1041 of the second pixel 104, the first sub-pixel 1051 of the third pixel 105, and the first sub-pixel 1061 of the fourth pixel 106. The first sub-pixel 1031 of the first pixel 103, the first sub-pixel 1041 of the second pixel 104, the first sub-pixel 1051 of the third pixel 105, and the first sub-pixel 1061 of the fourth pixel 106 all include the first light-emitting material 301 located in the two first banks 101.

Similarly, the second sub-pixel 3012 includes: the second sub-pixel 1032 of the first pixel 103, the second sub-pixel 1042 of the second pixel 104, the second sub-pixel 1052 of the third pixel 105, and the second sub-pixel 1062 of the fourth pixel 106. The third sub-pixel 3013 includes: the third sub-pixel 1033 of the first pixel 103, the third sub-pixel 1043 of the second pixel 104, the third sub-pixel 1053 of the third pixel 105, and the third sub-pixel 1063 of the fourth pixel 106. The second light-emitting material 302 and the third light-emitting material 303 are simultaneously formed between the same two first banks 101, such that the second sub-pixel 1032 of the first pixel 103, the second sub-pixel 1042 of the second pixel 104, the second sub-pixel 1052 of the third pixel 105, the second sub-pixel 1062 of the fourth pixel 106, the third sub-pixel 1033 of the first pixel 103, the third sub-pixel 1043 of the second pixel 104, the third sub-pixel 1053 of the third pixel 105, and the third sub-pixel 1063 of the fourth pixel 106 include the second light-emitting material 302 and the third light-emitting material 303, respectively, so as to improve the aperture ratio while reducing the manufacturing process.

Further, the light-emitting colors of the first light-emitting material 301, the second light-emitting material 302, and the third light-emitting material 303 include blue, red, green, yellow, and white. Furthermore, the light-emitting color of the first light-emitting material 301 is blue, and the light-emitting colors of the second light-emitting material 302 and the third light-emitting material 303 includes one of blue, red, green, yellow, and white, so as to improve the aperture ratio of the first sub-pixel 3011, and to avoid the problem that the width of the second sub-pixel 3012 and the third sub-pixel 3013 is too small to meet the process requirements.

It is understandable that the display panel further includes a color filter. The color filter includes: a first color filter unit corresponding to the first sub-pixel 3011, a second color filter unit corresponding to the second sub-pixel 3012, and a third color filter unit corresponding to the third sub-pixel 3013. The colors of the first color filter unit, the second color filter unit and the third color filter unit are different, such that the color filter cooperates with the first sub-pixel 3011, the second sub-pixel 3012, and the third sub-pixel 3013 to realize the full-color display of the display panel. Further, the second color filter unit is one of a red color filter unit or a green color filter unit, and the third color filter unit is the other of a red color filter unit or a green color filter unit.

In addition, the first light-emitting material 301, the second light-emitting material 302, and the third light-emitting material 303, and/or the first color filter unit, the second color filter unit, and the third color filter unit further include quantum dot materials, perovskite materials, fluorescent materials, etc., so as to improve light-emitting efficiency.

Please continue to refer to FIG. 3A-FIG. 3C. The first light-emitting material 301 of the first sub-pixel 3011 between two adjacent first banks 101 has a first width W1. The second light-emitting material 302 of the second sub-pixel 3012 and the third light-emitting material 303 of the third sub-pixel 3013 between two adjacent first banks 101 have a second width W2. The first width W1 is greater than or equal to the second width W2.

Further, referring to FIGS. 2A to 2B and FIGS. 3A to 3B, the first width W1 is equal to the sum of the short axis lengths of the first sub-pixel 1031 of the first pixel 103 and the first sub-pixel 1041 of the second pixel 104.

Figure 4A:
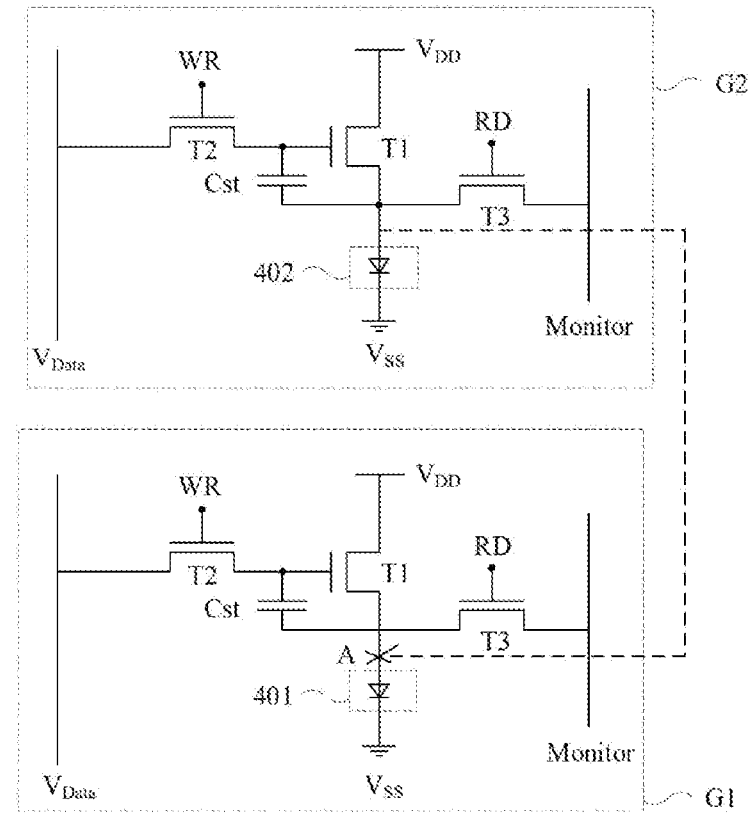
FIG. 4A to FIG. 4B are schematic structural diagrams of sub-pixel repair provided by embodiments of the application.
Figure 4B:
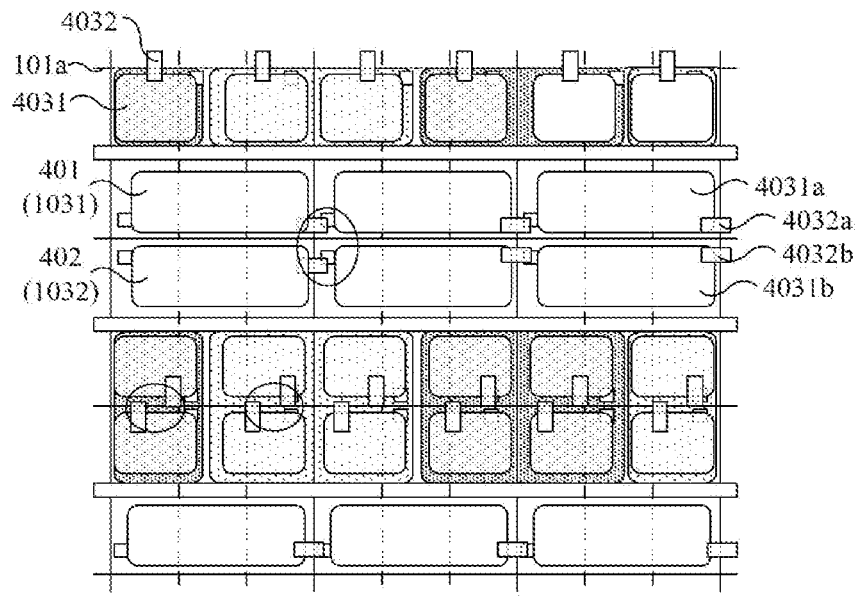

FIGS. 4A to 4B are schematic structural diagrams of the sub-pixel repair provided by the embodiments of the application. In the manufacturing process of the display panel, due to factors such as the manufacturing process, the pixel driving circuit in the display panel and the sub-pixels may be disconnected or short-circuited, which affects the display quality of the display panel. Therefore, in order to reduce the influence of the disconnection or short-circuit problem on the display panel during the manufacturing process, the repair method shown in FIGS. 4A to 4B is adopted to realize the electrical connection between the sub-pixels and the pixel driving circuit.

Specifically, the pixel driving circuit includes a 3T1C (3 transistors and 1 capacitor) structure for description. If there is a disconnection or short connection between the first sub-pixel 401 and the first pixel driving circuit G1, laser can be used to cut point A to disconnect the first sub-pixel 401 from the first pixel driving circuit G1. Then, laser welding is used to realize the electrical connection of the first sub-pixel 401 and the second pixel driving circuit G2, such that the second pixel circuit G2 can drive the first sub-pixel 401 and the second sub-pixel 402 at the same time. In this way, the electrical connection between the first sub-pixel 401 and the pixel driving circuit is realized. The light-emitting colors of the first sub-pixel 401 and the second sub-pixel 402 are the same. Vdata is a data signal, Cst is a storage capacitor, T1, T2, and T3 are transistors, VDD and VSS are power signals, WR and RD are control signals, and Monitor is a detection signal.

Specifically, please refer to FIGS. 2A, 3A, and 4B. The first sub-pixel 401 and the second sub-pixel 402 may be the first sub-pixel 1031 of the first pixel 103 and the first sub-pixel 1041 of the second pixel 104, respectively. Each pixel repeating unit further includes a first electrode layer 403. The first light-emitting material 301, the second light-emitting material 302, and the third light-emitting material 303 are respectively located on the first electrode layer 403. The first electrode layer 403 includes a plurality of electrode portions 4031 and bridge portions 4032 extending from the electrode portions 4031. The bridge portions 4032 are electrically connected to the pixel driving circuit, wherein, in a top view, the plurality of bridge portions 4032 are located on both sides of the center line 101a between the two adjacent first banks 101, and are close to the center line 101a.

Further, the electrode portion 4031 includes a first electrode portion 4031a and a second electrode portion 4031b located on both sides of the center line 101a. The bridge portion 4032 includes a first bridge portion 4032a extending from the first electrode portion 4031a and a second bridge portion 4032b extending from the second electrode portion 4031b. The pixel driving circuit includes a first pixel driving circuit electrically connected to the first bridge portion 4032a and a second pixel driving circuit electrically connected to the second bridge portion 4032b. The first sub-pixel 1031 of the first pixel 103 includes the first electrode portion 4031a. The first sub-pixel 1041 of the second pixel 104 includes the second electrode portion 4031b. When the electrical connection between the first bridge portion 4032a and the first pixel driving circuit fails, the first bridge portion 4032a cuts the connection with the first pixel driving circuit through a laser process, and the second bridge portion 4032b is welded to the first electrode portion 4031a through a laser process.

Similarly, the first sub-pixel 401 and the second sub-pixel 402 may also be the second sub-pixel 1042 of the second pixel 104 and the second sub-pixel 1032 of the first pixel 103, or the first sub-pixel 401 and the second sub-pixel 402 may also be the third sub-pixel 1043 of the second pixel 104 and the third sub-pixel 1033 of the first pixel 103, etc. In this way, adjacent sub-pixels of the same color can be repaired by laser welding. It is understandable that the pixel driving circuit may also be in the form of 5T1C, 7T1C, 7T2C, etc., which will not be repeated here.

Please continue to refer to FIG. 1B. The display panel further includes a substrate 111. The plurality of pixel driving circuits 112 and the pixel repeating unit 102 are all located on the substrate 111. A groove 101b is formed between two adjacent first banks 101. The first light-emitting material is located in the groove 101b. The second light-emitting material and the third light-emitting material are located in the same groove 101b, wherein the first bank 101 can be made of double-layer bank materials Bank1 and Bank2 to improve wettability of the first bank 101 to the flat layer PLN and the first electrode layer 403.

The display panel further includes a light shielding layer LS, a buffer layer BL, an insulating layer IL, a protective layer PVS, and a flat layer PLN on the substrate 111. The pixel driving circuit 112 includes a transistor. The transistor includes: an active layer AL, a gate insulating layer GI located on the active layer AL, a gate G located on the gate insulating layer GI and arranged opposite to the active layer AL, and the source S and the drain D electrically connected to the active layer AL.

In addition, the display panel also includes: a capacitor substrate layer AD prepared in the same layer as the active layer AL, and a source-drain layer SD prepared in the same layer as the source electrode S and the drain electrode D. The capacitor substrate layer AD forms a capacitor with the light shielding layer LS and the source/drain layer SD, respectively.

Figure 5A:
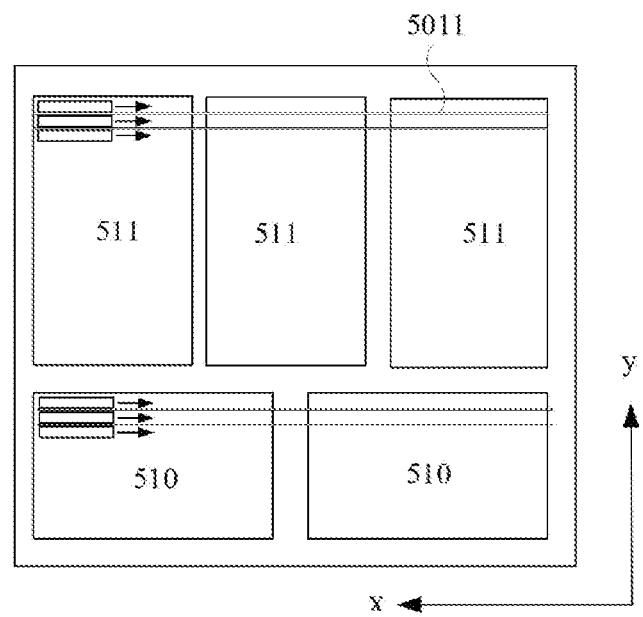
FIG. 5A to FIG. 5B are schematic structural diagrams of a display motherboard provided by embodiments of the application.
Figure 5B:
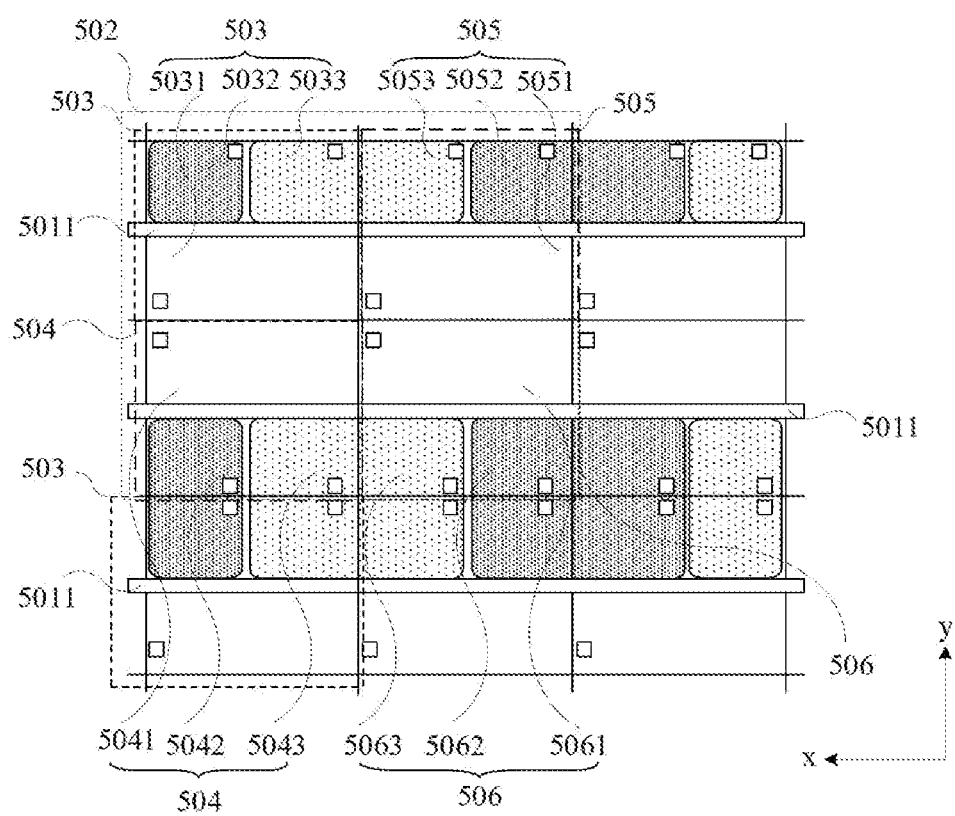

As shown in FIG. 5A to FIG. 5B, which are schematic structural diagrams of a display motherboard provided by the embodiments of the application. The embodiment of the present application also provides a display motherboard. The display motherboard includes: a plurality of first partitions 5011 arranged at intervals, wherein each of the first partitions 5011 extends along the first direction x, and the plurality of first partitions 5011 are arranged along the second direction y; and a plurality of display panels including a first display panel 510 and a second display panel 511 with different sizes, wherein a long side of the first display panel 510 is parallel to the first bank 5011, and a short side of the second display panel 511 is parallel to the first bank 5011.

Each of the first display panels 510 and each of the second display panels 511 include a plurality of pixel repeating units 502. Each pixel repeating unit 502 includes a plurality of pixels. Each of the pixels includes a first sub-pixel, and a second sub-pixel, and a third sub-pixel arranged along the first direction x. The first sub-pixel together with the second sub-pixel and the third sub-pixel arranged along the first direction x are respectively located on both sides of the first bank 5011. The long axis of the first sub-pixel is parallel to the first bank 5011. In the prior art, when the first sub-pixels, the second sub-pixels, and the third sub-pixels are arranged along the second direction y, three first banks are required. In the embodiment of the present application, the second sub-pixels and the third sub-pixels are arranged along a first direction, and he second sub-pixels and the third sub-pixels together with the first sub-pixels are located on both sides of the first bank. The number of the first banks can be reduced, and the pixel area ratio can be increased, such that the display panel can take into account both the aperture ratio requirements and the printing process requirements, which is beneficial to mass production.

Further, the first sub-pixel includes a first light-emitting material, the second sub-pixel includes a second light-emitting material, and the third sub-pixel includes a third light-emitting material. The first light-emitting material of the first sub-pixel between two adjacent first banks 5011 is integrally formed. The second light-emitting material of the second sub-pixel and the third light-emitting material of the third sub-pixel between two adjacent first banks are the same and are integrally formed, such that the display motherboard can use a linear bank printing method to achieve simultaneous printing of pixels on display panels of different sizes. The printing direction is shown by the arrow in FIG. 5A. It is helpful to simplify the manufacturing process and reduce the difficulty of the display panel manufacturing process. It is beneficial to realize mass production and realize the high-resolution design of the display panel.

Further, the light-emitting colors of the first light-emitting material, the second light-emitting material, and the third light-emitting material include blue, red, green, yellow, and white. Furthermore, the light-emitting color of the first light-emitting material is blue, and the light-emitting colors of the second light-emitting material and the third light-emitting material includes one of blue, red, green, yellow, and white, so as to improve the aperture ratio of the first sub-pixel, and to avoid the problem that the width of the second sub-pixel and the third sub-pixel is too small to meet the process requirements.

It can be understood that both the first display panel 510 and the second display panel 511 include color filters. The color filter includes: a first color filter unit corresponding to the first sub-pixel, a second color filter unit corresponding to the second sub-pixel, and a third color filter unit corresponding to the third sub-pixel. The colors of the first color filter unit, the second color filter unit, and the third color filter unit are different, so that the color filter cooperates with the first sub-pixel, the second sub-pixel, and the third sub-pixel to realize full-color display of the display panel. Further, the second color filter unit is one of a red color filter unit or a green color filter unit, and the third color filter unit is the other of a red color filter unit or a green color filter unit.

In addition, the first light-emitting material, the second light-emitting material, and the third light-emitting material, and/or the first color filter unit, the second color filter unit, and the third color filter unit further include quantum dot materials, perovskite materials, fluorescent materials, etc., so as to improve light-emitting efficiency.

Further, please refer to FIG. 5B. The pixels include: a first pixel 503 and a second pixel 504 arranged along the second direction x, and a third pixel 505 arranged on one side of the first pixel 503 along the first direction x, and a fourth pixel 506 arranged on one side of the second pixel 504 along the first direction x. The second pixel 504 and the first pixel 503 are arranged symmetrically or repeatedly along the adjacent edges of the second pixel 504 and the first pixel 503. The third pixel 505 and the first pixel 503 are arranged symmetrically or repeatedly along the adjacent edges of the first pixel 503 and the third pixel 505. The fourth pixel 506 and the second pixel 504 are arranged symmetrically or repeatedly along the adjacent edges of the second pixel 504 and the fourth pixel 506.

That is, the first sub-pixel 5031 of the first pixel 503 together with the second sub-pixel 5032 and the third sub-pixel 5033 of the first pixel 503 are respectively located on both sides of the corresponding first bank 5011. The first sub-pixel 5041 of the second pixel 504 together with the second sub-pixel 5042 and the third sub-pixel 5043 of the second pixel 504 are respectively located on both sides of another corresponding first bank 5011. Similarly, the first sub-pixel 5051 of the third pixel 505 together with the second sub-pixel 5052 and the third sub-pixel 5053 of the third pixel 505 are respectively located on both sides of the corresponding first bank 5011. The first sub-pixel 5061 of the fourth pixel 506 together with the second sub-pixel 5062 and the third sub-pixel 5063 of the fourth pixel 506 are respectively located on both sides of another corresponding first bank 5011. The third sub-pixel 5033 of the first pixel 503 is arranged adjacent to the second sub-pixel 5052 or the third sub-pixel 5053 of the third pixel 505. The third sub-pixel 5043 of the second pixel 504 together with the second sub-pixel 5062 or the third sub-pixel 5063 of the fourth pixel 506 are arranged adjacent to each other. The second sub-pixel 5031 and the third sub-pixel 5032 of the first pixel 503 together with the first sub-pixel 5041 of the second pixel 504 or the second sub-pixel 5042 and the third sub-pixel 5043 of the second pixel 504 are arranged adjacent to each other.

When the third sub-pixel 5033 of the first pixel 503 is adjacent to the third sub-pixel 5053 of the third pixel 505, the third color filter unit corresponding to the third pixel 5031 of the first pixel 503 in the color filter together with the third color filter unit corresponding to the third pixel 5043 of the third pixel 505 in the color filter may be integrally formed. Similarly, when the third sub-pixels of the first pixel 503 to the fourth pixel 506 are all adjacent. The third color filter unit corresponding to the third sub-pixel of the first pixel 503 to the fourth pixel 506 in the color filter is integrally formed. Or, when the second sub-pixels of the first pixel 503 to the fourth pixel 506 are all adjacent, the second color filter unit corresponding to the second sub-pixel of the first pixel 503 to the fourth pixel 506 in the color filter is integrally formed.

Further, the display motherboard may further include a second bank extending in the second direction y, and two ends of the second bank are respectively connected to the two first bank 5011. The second bank is located between the second sub-pixel and the third sub-pixel, or located at the center of the first sub-pixel, or located on both sides of the first sub-pixel.

In addition, the size of the first display panel 510 and the second display panel 511 can also be the same, and will not be repeated here.

The present application also provides a display device, including any of the above-mentioned display panels.

In the above-mentioned embodiments, the description of each embodiment has its own emphasis. For parts that are not described in detail in an embodiment, reference may be made to related descriptions of other embodiments. Specific examples are used in this article to describe the principles and implementation of the application, and the description of the above examples is only used to help understand the technical solutions and core ideas of the application. Those of ordinary skill in the art should understand that: it is still possible to modify the technical solutions recorded in the foregoing embodiments, or equivalently replace some of the technical features. However, these modifications or replacements do not cause the essence of the corresponding technical solutions to deviate from the scope of the technical solutions of the embodiments of the present application.

The invention claimed is:

1. A display panel, comprising:
 a plurality of first banks arranged at intervals, wherein each of the first banks extends in a first direction, and the plurality of first banks are arranged in a second direction;
 a plurality of pixel repeating units, wherein each of the pixel repeating units includes a plurality of pixels and a first electrode layer; and
 a pixel driving circuit,
 wherein the pixels comprise respective first sub-pixels, second sub-pixels and third sub-pixels, a long side of each of the first sub-pixels extends along the first direction, and one of the second sub-pixels and one of the third sub-pixels in each of the pixels are arranged in the first direction,
 wherein the first electrode layer comprises:
 a plurality of electrode portions respectively in the first sub-pixels, the second sub-pixels, and the first third sub-pixels; and
 a plurality of bridge portions respectively extending from the electrode portions,
 wherein the bridge portions are electrically connected to the pixel driving circuit, and
 in each of the pixels, one of the first sub-pixels is linear bank printed on a side of one of the first banks, one of the second sub-pixels and one of the third sub-pixels are linear bank printed on an other side of the one of the first banks, and in a top view, three of the bridge portions respectively in the one of the first sub-pixels linear bank printed on the side of one of the first banks, the one of the second sub-pixels and the one of the third sub-pixels linear bank printed on the other side of the one of the first banks are all located away from the one of the first banks.

2. The display panel according to claim 1, wherein the pixels comprise a first pixel and a second pixel, wherein the second pixel is arranged on a side of the first pixel along the second direction, and the second pixel and the first pixel are symmetrically arranged along an adjacent edge of the second pixel and the first pixel.

3. The display panel according to claim 1, wherein the pixels further comprise a third pixel and a fourth pixel arranged along the second direction, wherein third pixel is arranged on a side of the first pixel along the first direction, the third pixel and the first pixel are symmetrically arranged along an adjacent edge of the first pixel and the third pixel, the fourth pixel is arranged on a side of the second pixel along the first direction, and the fourth pixel and the second pixel are symmetrically arranged along an adjacent edge of the second pixel and the fourth pixel.

4. The display panel according to claim 3,
 wherein the first sub-pixels comprise a first light-emitting material, the second sub-pixels comprise a second light-emitting material, and the third sub-pixels comprise a third light-emitting material,
 wherein a part of the first sub-pixels between two adjacent ones of the first banks is are integrally formed of the first light-emitting material, and
 wherein a part of the second sub-pixels and a part of the third sub-pixels between two adjacent ones of the first banks are integrally formed of a same light-emitting material.

5. The display panel according to claim 4, wherein the first light-emitting material of the part of the first sub-pixels has a first width, and the same light-emitting material has a second width, wherein the first width is greater than or equal to the second width.

6. The display panel according to claim 5, wherein the first width is equal to a sum of short axis lengths of two of the first sub-pixels respectively in the first pixel and the second pixel.

7. The display panel according to claim 4, wherein the display panel further includes a color filter, and the color filter includes: a second color filter unit corresponding to the second sub-pixel, and a third color filter unit corresponding to the third sub-pixel, wherein the second color filter unit and the third color filter unit have different colors.

8. The display panel according to claim 7, wherein the second color filter unit is one of a red color filter unit or a green color filter unit, and the third color filter unit is an other of the red color filter unit or the green color filter unit.

9. The display panel according to claim 4, wherein a light-emitting color of the first light-emitting material is blue, and light-emitting colors of the second light-emitting material and the third light-emitting material are red, yellow, green, or white.

10. The display panel according to claim 4, wherein the first light-emitting material, the second light-emitting material, and the third light-emitting material are located on the first electrode layer.

11. The display panel according to claim 10, wherein the electrode portions comprise a first electrode portion and a second electrode portion respectively disposed between two adjacent ones of the first banks, the bridge portions comprise a first bridge portion extending from the first electrode portion and a second bridge portion extending from the second electrode portion,
wherein the pixel drive circuit includes: a first pixel drive sub-circuit electrically connected to the first bridge portion; and a second pixel drive sub-circuit electrically connected to the second bridge portion;
the first electrode portion is disposed in one of the first sub-pixels in the first pixel, and the second electrode portion is disposed in one of the first sub-pixels in the second pixel,
and
when an electrical connection between the first bridge portion and the first pixel drive sub-circuit fails, the first bridge portion cuts off the connection with the first pixel drive sub-circuit through a laser process, and the second bridge portion is welded to the first electrode portion through a laser process.

12. The display panel according to claim 1, further comprising:
a second bank extending in the second direction, wherein both ends of the second bank are connected to two adjacent ones of the first banks respectively; and the second bank is located between one of the second sub-pixels and one of the third sub-pixels which are adjacent, or located on both sides of one of the first sub-pixels.

13. A display motherboard, further comprising:
a plurality of first banks arranged at intervals, wherein each of the first partitions extends in a first direction, and the plurality of first banks are arranged along a second direction; and
a plurality of display panels including first display panels and second display panels with different sizes, wherein a long side of each of the first display panels is parallel to the first banks, and a short side of each of the second display panels is parallel to the first banks;
wherein each of the first display panels includes a plurality of pixel repeating units, and each of the pixel repeating units includes a plurality of pixels and a first electrode layer; and
a pixel driving circuit,
wherein the pixels comprise respective first sub-pixels, second sub-pixels and third sub-pixels, a long side of each of the first sub-pixels extends along the first direction, and one of the second sub-pixels and one of the third sub-pixels in each of the pixels are arranged in the first direction,
wherein the first electrode layer comprises:
a plurality of electrode portions respectively in the first sub-pixels, the second sub-pixels, and the first third sub-pixels; and
a plurality of bridge portions respectively extending from the electrode portions,
wherein the bridge portions are electrically connected to the pixel driving circuit, and
in each of the pixels, one of the first sub-pixels is linear bank printed on a side of one of the first banks, one of the second sub-pixels and one of the third sub-pixels are linear bank printed on an other side of the one of the first banks, and in a top view, three of the bridge portions respectively in the one of the first sub-pixels linear bank printed on the side of one of the first banks, the one of the second sub-pixels and the one of the third sub-pixels linear bank printed on the other side of the one of the first banks are all located away from the one of the first banks.

14. The display motherboard according to claim 13,
wherein the first sub-pixels comprise a first light-emitting material, the second sub-pixels comprise a second light-emitting material, and the third sub-pixels comprise a third light-emitting material,
wherein a part of the first sub-pixels between two adjacent ones of the first banks are integrally formed of the first light-emitting material, and
wherein a part of the second sub-pixels and a part of the third sub-pixels between two adjacent ones of the first banks are integrally formed of a same light-emitting material.

15. The display motherboard according to claim 14, wherein the first display panel further includes a color filter comprising: a second color filter unit corresponding to the second sub-pixel, and a third color filter unit corresponding to the third sub-pixel, wherein the second color filter unit and the third color filter unit have different colors.

16. A display device, comprising a display panel comprising:
a plurality of first banks arranged at intervals, wherein each of the first banks extends in a first direction, and the plurality of first banks are arranged in a second direction;
a plurality of pixel repeating units, wherein each of the pixel repeating units includes a plurality of pixels and a first electrode layer; and
a pixel driving circuit,
wherein the pixels comprise respective first sub-pixels, second sub-pixels and third sub-pixels, a long side of each of the first sub-pixels extends along the first direction, and one of the second sub-pixels and one of the third sub-pixels in each of the pixels are arranged in the first direction,
wherein the first electrode layer comprises:
a plurality of electrode portions respectively in the first sub-pixels, the second sub-pixels, and the first third sub-pixels; and
a plurality of bridge portions respectively extending from the electrode portions,
wherein the bridge portions are electrically connected to the pixel driving circuit, and
in each of the pixels, one of the first sub-pixels is linear bank printed on a side of one of the first banks, one of the second sub-pixels and one of the third sub-pixels are linear bank printed on an other side of the one of the first banks, and in a top view, three of the bridge portions respectively in the one of the first sub-pixels linear bank printed on the side of one of the first banks, the one of the second sub-pixels and the one of the third sub-pixels linear bank printed on the other side of the one of the first banks are all located away from the one of the first banks.

17. The display device according to claim 16, wherein the pixels comprise a first pixel and a second pixel, wherein the second pixel is arranged on a side of the first pixel along the second direction, and the second pixel and the first pixel are symmetrically arranged along an adjacent edge of the second pixel and the first pixel.

18. The display device according to claim 17, wherein the pixels further comprise a third pixel and a fourth pixel arranged along the second direction, wherein third pixel is arranged on a side of the first pixel along the first direction, the third pixel and the first pixel are symmetrically arranged along an adjacent edge of the first pixel and the third pixel, the fourth pixel is arranged on a side of the second pixel along the first direction, and the fourth pixel and the second pixel are symmetrically arranged along an adjacent edge of the second pixel and the fourth pixel.

19. The display device according to claim 18, wherein the first sub-pixels comprise a first light-emitting material, the second sub-pixels comprise a second light-emitting material, and the third sub-pixels comprise a third light-emitting material,
wherein a part of the first sub-pixels between two adjacent ones of the first banks are integrally formed of the first light-emitting material, and
wherein a part of the second sub-pixels and a part of the third sub-pixels between two adjacent ones of the first banks are integrally formed of a same light-emitting material.

20. The display device according to claim 19, wherein the first light-emitting material of the part of the first sub-pixels has a first width, and the same light-emitting material has a second width, wherein the first width is greater than or equal to the second width.

* * * * *